United States Patent [19]

Nakamura et al.

[11] Patent Number: 5,327,134
[45] Date of Patent: Jul. 5, 1994

[54] D-A CONVERTER

[75] Inventors: Yasuyuki Nakamura; Toshio Kumamoto, both of Itami, Japan

[73] Assignee: Mitsubishi Denki Kabushiki Kaisha, Tokyo, Japan

[21] Appl. No.: 951,116

[22] Filed: Sep. 25, 1992

[30] Foreign Application Priority Data

Oct. 7, 1991 [JP] Japan ............... 3-259081
Jun. 12, 1992 [JP] Japan ............... 4-153182

[51] Int. Cl.⁵ ............................. H03M 1/66
[52] U.S. Cl. ........................ 341/144; 341/118
[58] Field of Search ................. 341/118, 144

[56] References Cited

U.S. PATENT DOCUMENTS

| | | | |
|---|---|---|---|
| 4,910,514 | 3/1990 | Irmer et al. | 341/64 |
| 4,935,741 | 6/1990 | Reich | 341/150 |
| 4,967,140 | 10/1990 | Groeneveld et al. | 323/315 |
| 5,036,322 | 7/1991 | Barron et al. | 341/144 |
| 5,162,800 | 11/1992 | Ogawara | 341/144 |
| 5,181,034 | 1/1993 | Takakura et al. | 341/144 |

*Primary Examiner*—Marc S. Hoff
*Attorney, Agent, or Firm*—Oblon, Spivak, McClelland, Maier & Neustadt

[57] ABSTRACT

In order to improve linearlity of analog current outputs with respect to input digital codes in a D-A converter formed by a matrix array of unit current sources, respective current source cells forming the matrix are connected by analog ground wires (101 to 105) along respective rows. Analog ground wires (301, 302) connect left sides of the analog ground wires (102, 104) and right sides of the analog ground wires (101, 103, 105) to pads (41, 42) respectively, to ground the same. Thus, large-small relations of current distributions are reversed in respective rows, whereby influences by the current distributions are cancelled.

45 Claims, 23 Drawing Sheets

F I G. 1
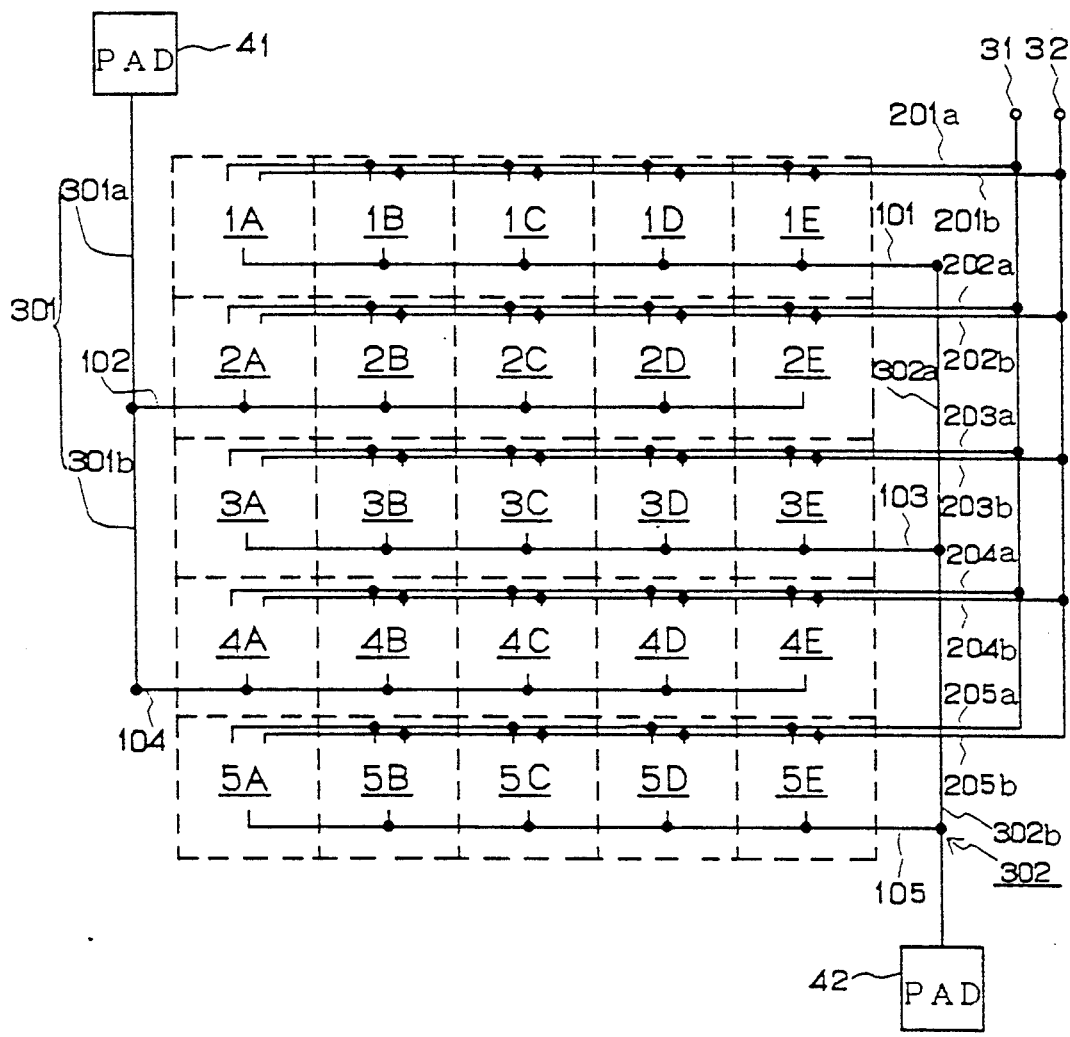

F I G. 6

|   | Ⓐ | Ⓑ | Ⓒ | Ⓓ | Ⓔ |
|---|---|---|---|---|---|
| ① | 2.7 | 3.7 | 4.7 | 5.7 | 6.7 |
| ② | 10 | 9 | 8 | 7 | 6 |
| ③ | 4.4 | 5.4 | 6.4 | 7.4 | 8.4 |
| ④ | 7.5 | 6.5 | 5.5 | 4.5 | 3.5 |
| ⑤ | 6 | 7 | 8 | 9 | 10 |

F I G. 7

|   | Ⓐ | Ⓑ | Ⓒ | Ⓓ | Ⓔ |
|---|---|---|---|---|---|
| ① | 1 | 6 | 11 | 16 | 21 |
| ② | 2 | 7 | 12 | 17 | 22 |
| ③ | 3 | 8 | 13 | 18 | 23 |
| ④ | 4 | 9 | 14 | 19 | 24 |
| ⑤ | 5 | 10 | 15 | 20 | 25 |

FIG. 9
(PRIOR ART)

|   | Ⓐ | Ⓑ | Ⓒ | Ⓓ | Ⓔ |
|---|---|---|---|---|---|
| ① | 2 | 3 | 4 | 5 | 6 |
| ② | 3 | 4 | 5 | 6 | 7 |
| ③ | 4 | 5 | 6 | 7 | 8 |
| ④ | 5 | 6 | 7 | 8 | 9 |
| ⑤ | 6 | 7 | 8 | 9 | 10 |

FIG. 11
(PRIOR ART)

|   | Ⓐ | Ⓑ | Ⓒ | Ⓓ | Ⓔ |
|---|---|---|---|---|---|
| ① | 1 | 2 | 3 | 4 | 5 |
| ② | 6 | 7 | 8 | 9 | 10 |
| ③ | 11 | 12 | 13 | 14 | 15 |
| ④ | 16 | 17 | 18 | 19 | 20 |
| ⑤ | 21 | 22 | 23 | 24 | 25 |

FIG. 12
(PRIOR ART)

|   | Ⓐ | Ⓑ | Ⓒ | Ⓓ | Ⓔ |
|---|---|---|---|---|---|
| ① | 1 | 2 | 3 | 4 | 5 |
| ② | 11 | 12 | 13 | 14 | 15 |
| ③ | 21 | 22 | 23 | 24 | 25 |
| ④ | 16 | 17 | 18 | 19 | 20 |
| ⑤ | 6 | 7 | 8 | 9 | 10 |

FIG. 13

|   | Ⓐ | Ⓑ | Ⓒ | Ⓓ | Ⓔ |
|---|---|---|---|---|---|
| ① | 1 | 11 | 21 | 16 | 6 |
| ② | 2 | 12 | 22 | 17 | 7 |
| ③ | 3 | 13 | 23 | 18 | 8 |
| ④ | 4 | 14 | 24 | 19 | 9 |
| ⑤ | 5 | 15 | 25 | 20 | 10 |

FIG. 14

|   | Ⓐ | Ⓑ | Ⓒ | Ⓓ | Ⓔ |
|---|---|---|---|---|---|
| ① | 4 | 14 | 24 | 19 | 9 |
| ② | 2 | 12 | 22 | 17 | 7 |
| ③ | 1 | 11 | 21 | 16 | 6 |
| ④ | 3 | 13 | 23 | 18 | 8 |
| ⑤ | 5 | 15 | 25 | 20 | 10 |

FIG. 15

|   | Ⓐ | Ⓑ | Ⓒ | Ⓓ | Ⓔ |
|---|---|---|---|---|---|
| ① | 4 | 2 | 1 | 3 | 5 |
| ② | 14 | 12 | 11 | 13 | 15 |
| ③ | 24 | 22 | 21 | 23 | 25 |
| ④ | 19 | 17 | 16 | 18 | 20 |
| ⑤ | 9 | 7 | 6 | 8 | 10 |

FIG. 16

|   | Ⓐ | Ⓑ | Ⓒ | Ⓓ | Ⓔ |
|---|---|---|---|---|---|
| ① | 1 | 5 | 9 | 13 | 3 |
| ② | 16 | 20 | 22 | 19 | 7 |
| ③ | 12 | 23 | 25 | 24 | 11 |
| ④ | 8 | 18 | 21 | 17 | 15 |
| ⑤ | 4 | 14 | 10 | 6 | 2 |

FIG. 17

|   | Ⓐ | Ⓑ | Ⓒ | Ⓓ | Ⓔ |
|---|----|----|----|----|----|
| ① | 21 | 22 | 23 | 24 | 25 |
| ② | 20 | 7  | 8  | 9  | 10 |
| ③ | 19 | 6  | 1  | 2  | 11 |
| ④ | 18 | 5  | 4  | 3  | 12 |
| ⑤ | 17 | 16 | 15 | 14 | 13 |

FIG. 18

|   | Ⓐ | Ⓑ | Ⓒ | Ⓓ | Ⓔ |
|---|----|----|----|----|----|
| ① | 1  | 2  | 3  | 4  | 5  |
| ② | 16 | 17 | 18 | 19 | 6  |
| ③ | 15 | 24 | 25 | 20 | 7  |
| ④ | 14 | 23 | 22 | 21 | 8  |
| ⑤ | 13 | 12 | 11 | 10 | 9  |

FIG. 2 2

|   | Ⓐ | Ⓑ | Ⓒ | Ⓓ | Ⓔ |
|---|---|---|---|---|---|
| ① | 6.7 | 6 | 8.4 | 3.5 | 10 |
| ② | 5.7 | 7 | 7.4 | 4.5 | 9 |
| ③ | 4.7 | 8 | 6.4 | 5.5 | 8 |
| ④ | 3.7 | 9 | 5.4 | 6.5 | 7 |
| ⑤ | 2.7 | 10 | 4.4 | 7.5 | 6 |

FIG. 25A

|   | A | B | C | D | E |
|---|---|---|---|---|---|
| ① | 1.7 | 2.5 | 3.4 | 5 | 5 |
| ② | 5 | 5 | 3.4 | 2.5 | 1.7 |
| ③ | 1.7 | 2.5 | 3.4 | 5 | 5 |
| ④ | 5 | 5 | 3.4 | 2.5 | 1.7 |
| ⑤ | 5 | 5 | 3.4 | 2.5 | 1.7 |

FIG. 25B

|   | A | B | C | D | E |
|---|---|---|---|---|---|
| ① | 1.7 | 5 | 1.7 | 5 | 1.7 |
| ② | 2.5 | 5 | 2.5 | 5 | 2.5 |
| ③ | 3.4 | 3.4 | 3.4 | 3.4 | 3.4 |
| ④ | 5 | 2.5 | 5 | 2.5 | 5 |
| ⑤ | 5 | 1.7 | 5 | 1.7 | 5 |

FIG. 26

|   | A | B | C | D | E |
|---|---|---|---|---|---|
| ① | 3.4 | 7.5 | 5.1 | 10 | 6.7 |
| ② | 7.5 | 10 | 5.9 | 7.5 | 4.2 |
| ③ | 5.1 | 5.9 | 6.8 | 8.4 | 8.4 |
| ④ | 10 | 7.5 | 8.4 | 5 | 6.7 |
| ⑤ | 6.7 | 4.4 | 8.4 | 6.7 | 10 |

D-A CONVERTER

BACKGROUND OF THE INVENTION

1. Field of the Invention

The present invention relates to a D-A converter, and more particularly, it relates to a current cell matrix DA converter which comprises a cell array arranged in the form of a matrix.

2. Description of the Background Art

FIG. 29 schematically illustrates a matrix of current source cells forming a part of a conventional current cell matrix D-A converter. Throughout the specification, the rows, i.e., the transverse lists of such a matrix are successively numbered starting with 1 from top to bottom. On the other hand, the columns, i.e., the vertical lists of the matrix are successively alphabetized starting from A from left to right. These numbers and symbols are encircled in the drawings. In order to specify one element of such a matrix, the number and symbol indicating its row and column are combined such as "1A" for the cell which is located on the upper left corner of the matrix, for example. Such combinations may also appear in the drawings.

Each of the current source cells 1A, 1B, . . . , 5D, 5E arranged in five rows and five columns comprises a unit current source 20 and a changeover switch 21. Referring to FIG. 29, these reference numerals appear only in relation to the current source cell 1A, for the purpose of simplification.

First ends of the unit current sources 20 are connected along the row direction by row-directionally extending analog source lines (analog ground wires) 101 to 105, and grounded by a column-directionally extending analog ground wire 300. Second ends of the unit current sources 20 are connected to first and second output terminals 31 and 32 through the changeover switches 21 and lead wires 201a to 205a and 201b to 205b respectively. The first and second output terminals 31 and 32 complementarily supply output currents to the exterior.

In the D-A converter having the aforementioned structure, the current source cells 1A, 1B, . . . , 5D, 5E drive the changeover switches 21 provided therein in response to input digital codes, to connect the unit current sources 20 to either one of the first and second output terminals 31 and 32. Thus, currents which are responsive to the input digital codes flow to the first output terminal 31, for D-A conversion.

FIG. 30 is a more simplified version of FIG. 29. In order to clarify the connection between the analog ground wires 300 and 101 to 105 and the lead wires 201a to 205a and 201b to 205b, the unit current sources 20 and the changeover switches 21 are omitted and the contours of the cells are shown in broken lines. In general, the analog ground wires 101 to 105 which are connected by the analog ground wire 300 are further connected to a pad 40 in common, to be grounded.

In the conventional current cell matrix D-A converter, however, the analog ground wires 101 to 105 connecting the first ones of the unit current sources provided in the current source cells are unidirectionally extracted toward the right side in FIGS. 29 and 30, for example, to be connected in common by the analog ground wire 300, and then connected to one or more pads provided in the same direction.

The unit current sources 20 are generally driven by a bias voltage which is supplied to all current source cells in common, to supply currents whose values depend on the bias voltage. When potentials in the analog ground wires 101 to 105 are distributed, therefore, the bias voltage so effectively fluctuates that the currents supplied from the output terminals 31 and 32 to the exterior are not necessarily an integral times those of the unit current sources 20.

For example, FIG. 31 shows an equivalent circuit around the cells 1A to 1E being connected by the analog ground wire 101, which is provided with a distributed resistance shown by ground wire resistances 14a to 14d. Due to such ground wire resistances 14a to 14d, potential distribution which is reduced from the cell 1A toward the cell 1E is caused in the analog ground wire 101.

Therefore, bias conditions for the unit current sources 20 are varied with the cells, and output currents of the unit current sources 20 are varied with the positions of the cells. Namely, current distribution which is increased from the cell 1A toward the cell 1E is caused as conceptually shown in the lowermost stage of FIG. 31.

If the analog ground wire 101 is grounded on its left side, on the other hand, potential distribution which is increased from the cell 1A toward the cell 1E is caused in the analog ground wire 101, while current distribution which is reduced from the cell 1A toward the cell 1E is caused as conceptually shown in the lowermost stage of FIG. 32.

This also applies to the cells which are column-directionally arranged. The analog ground wire 300 connects the analog ground wires 101 to 105 on the right side thereof, while the same is grounded on its lower part through the pad 40. Due to the distributed resistance caused in the analog ground wire 300, therefore, current distribution which is increased from the cell 1A toward the cell 5A is also caused in the column direction.

FIGS. 33A and 33B conceptually illustrates row-directional current distribution and column-directional current distribution, respectively. In practice, however, the unit current sources 20 are discretely provided in the respective cells, and states of current distribution are as shown in FIGS. 34A and 34B in correspondence to FIGS. 33A and 33B, respectively. Referring to FIGS. 341 and 34B, numerals shown in frames represent values of currents actually fed by the unit current sources 20 of the respective cells assuming that the unit current sources 20 feed currents of 5 when the ground wire resistances 14a to 14d are zero.

In the conventional D-A converter, the values of the currents fed by the unit current sources 20 differ from each other both in row and column directions, as hereinabove described. Thus, the actual analog outputs with respect to values represented by input digital codes are deteriorated in linearity with respect to ideal analog outputs.

SUMMARY OF THE INVENTION

The present invention has been proposed in order to solve the aforementioned problem, and an object thereof is to improve linearity of a D-A converter.

A D-A converter according to a first aspect of the present invention comprises (a) a plurality of complementary output cells, being arranged in the form of a matrix, each having (a-1) a changeover switch having a common terminal and first and second terminals and (a-2) a unit current source having a first end being connected to the common terminal and a second end, (b) a plurality of first analog lines connecting prescribed ones of the second ends of the unit current sources in common, (c) a pair of second analog lines connecting prescribed ones of the first analog lines to fixed potentials in common, (d) first and second output current terminals connected to all of the first and second terminals of the changeover switches respectively, and (e) a decoder receiving a digital signal and generating a control signal for controlling switching of the changeover switches on the basis of the digital signal, for successively working the complementary output cells one by one as the value indicated by the digital signal is increased. Further, (b-1) each first analog line connects all of the second ends of the unit current sources of the complementary output cells row-directionally arranged in common in each row, and (b-2) adjacent ones of the first analog lines are connected to different ones of the second analog lines, while (c-1) the pair of second analog lines extend on the opposite side of the complementary output cells in different directions substantially parallel to the column direction.

A D-A converter according to a second aspect of the present invention comprises (a) a plurality of complementary output cells, being arranged in the form of a matrix, each having (a-1) a changeover switch having a common terminal and first and second terminals and (a-2) a unit current source having a first end being connected to the common terminal and a second end, (b) a plurality of first analog lines connecting prescribed ones of the second ends of the unit current sources in common, (c) a pair of second analog lines connecting prescribed ones of the first analog lines to fixed potentials in common, (d) first and second output current terminals connected to all of the first and second terminals of the changeover switches respectively, and (e) a decoder receiving a digital signal and generating a control signal for controlling switching of the changeover switches on the basis of the digital signal for successively working the complementary output cells one by one as the value indicated by the digital signal is increased. Further, (b-1) each first analog line connects all of the second ends of the unit current sources of the complementary output cells column-directionally arranged in common in each column, and (b-2) adjacent ones of the first analog lines are connected to different ones of the second analog lines, while (c-1) the pair of second analog lines extend on the opposite side of the complementary output cells in different directions substantially parallel to the row direction.

A D-A converter according to a third aspect of the present invention comprises (a) a plurality of complementary output cells, being arranged in the form of a matrix, each having (a-1) a changeover switch having a common terminal and first and second terminals and (a-2) a unit current source having a first end being connected to the common terminal and a second end, (b) a plurality of first and second analog lines connecting prescribed ones of the second ends of the unit current sources in common, (c) a pair of third analog lines connecting prescribed ones of the first analog lines to fixed potentials in common and a pair of fourth analog lines connecting prescribed ones of the second analog lines to fixed potentials in common, (d) first and second output current terminals connected to all of the first and second terminals of the changeover switches respectively, and (e) a decoder receiving a digital signal and generating a control signal for controlling switching of the changeover switches on the basis of the digital signal for successively working the complementary output cells one by one as the value indicated by the digital signal is increased. The first analog lines (b-1) connect all of the second ends of the unit current sources of the complementary output cells belonging to odd columns in common in respective odd rows while (b-2) connecting all of the second ends of the unit current sources of the complementary output cells belonging to even columns in common in respective even rows, and the second analog lines (b-3) connect all of the second ends of the unit current sources of the complementary output cells belonging to even rows in common in respective odd columns while (b-4) connecting all of the second ends of the unit current sources of the complementary output cells belonging to odd rows in common in respective even columns. Further, (c-1) adjacent ones of the first analog lines are connected to different ones of the third analog lines and (c-2) the pair of third analog lines extend on the opposite side of the complementary output cells in different directions substantially parallel to the column direction, while (c-3) adjacent ones of the second analog lines are connected to different ones of the fourth analog lines and (c-4) the pair of fourth analog lines extend on the opposite side of the complementary output cells in different directions substantially parallel to the row direction.

The decoder provided in the inventive D-A converter drives the complementary output cells (e-1) successively from the first column toward the last column and (e-2) successively from the first row toward the last row in each column as the value indicated by the digital signal is increased.

Or, the former drives the latter (e-3) from the first row toward the last row, and (e-4) successively from the first column toward the last column in each row.

Or, the former drives the latter (e-5) alternately from the outermost row toward the innermost row in such order as the first row, the last row, the second row, . . . , and (e-6) successively from the first column toward the last column in each row.

Or, the former drives the latter (e-7) alternately from the outermost column toward the innermost column in such order as the first column, the last column, the second column, . . . and (e-8) successively from the first row toward the last row in each column.

Or, the former drives the latter (e-9) alternately from the outermost column toward the innermost column in such order as the first column, the last column, the second column, . . . , and (e-10) vertically alternately from the innermost row toward the outermost row in each column.

Or, the former drives the latter (e-11) alternately from the outermost row toward the innermost row in such order as the first row, the last row, the second row, . . . , and (e-12) transversely alternately from the innermost column toward the outermost column in each row.

Or, (e-13) the decoder divides the center of the matrix formed by the complementary output cells into a plurality of ring-shaped elements having the same center, and (e-14) symmetrically and successively drives the ring-shaped elements symmetrically about the center.

Or, (e-15) the decoder spirally and successively drives the complementary output cells outwardly from the center of the matrix.

Or, (e-16) the decoder spirally and successively drives the complementeary output cells from the outermost ones toward the center of the matrix.

According to each of the first and second aspects of the present invention, the second analog lines provide adjacent ones of the first analog lines with large-small relations of potential distributions in different directions, thereby cancelling effects of the potential distributions.

According to the third aspect of the present invention, the third analog lines provide adjacent ones of the first analog lines with large-small relations of potential distributions in different directions while the fourth analog lines provide adjacent ones of the second analog lines with large-small relations of potential distributions in different directions, thereby cancelling effects of the potential distributions.

According to the present invention, as hereinabove described, current distributions caused between current source cells by distributed resistances existing in analog lines, whereby it is possible to improve linearity of a D-A converter.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing a first embodiment of the present invention;

FIG. 6 is an explanatory diagram showing current distributions of respective cells in the first embodiment;

FIG. 7 is an explanatory diagram showing exemplary selection order for the respective cells;

FIG. 9 is an explanatory diagram showing current distributions of respective cells in the prior art;

FIG. 11 is an explanatory diagram showing another exemplary selection order for respective cells;

FIG. 12 is an explanatory diagram showing still another exemplary selection order for respective cells;

FIG. 13 is an explanatory diagram showing further exemplary selection order for respective cells;

FIG. 14 is an explanatory diagram showing further exemplary selection order for respective cells;

FIG. 15 is an explanatory diagram showing further exemplary selection order for respective cells;

FIG. 16 is an explanatory diagram showing further exemplary selection order for respective cells;

FIG. 17 is an explanatory diagram showing further exemplary selection order for respective cells;

FIG. 18 is an explanatory diagram showing further exemplary selection order for respective cells;

FIG. 22 is an explanatory diagram showing current distributions of respective cells in the second embodiment;

FIGS. 25A and 25B are explanatory diagrams showing current distributions of respective cells in the third embodiment;

FIG. 26 is an explanatory diagram showing current distributions of respective cells in the third embodiment;

DESCRIPTION OF THE PREFERRED EMBODIMENTS

First Embodiment

FIG. 1 schematically illustrates a matrix of current source cells forming a part of a current cell matrix D-A converter according to a first embodiment of the present invention.

While current source cells 1A, 1B, ..., 5E, which are arranged in five rows and five columns, comprise unit current sources 20 and changeover switches 21 respectively, such elements are omitted in FIG. 1 in order to clarify connection between analog ground wires 101 to 105, 301 and 302 and lead wires 201a to 205a and 201b to 205b, and contours of the cells 1A, 1B, ..., 5E are shown with broken lines.

The analog ground wires 101 to 105 are respectively connected with first ends of the unit current sources 20 provided in the current source cells 1A to 1E, 2A to 2E, 3A to 3E, 4A to 4E and 5A to 5E, which are arranged in the row direction.

Figure 2:
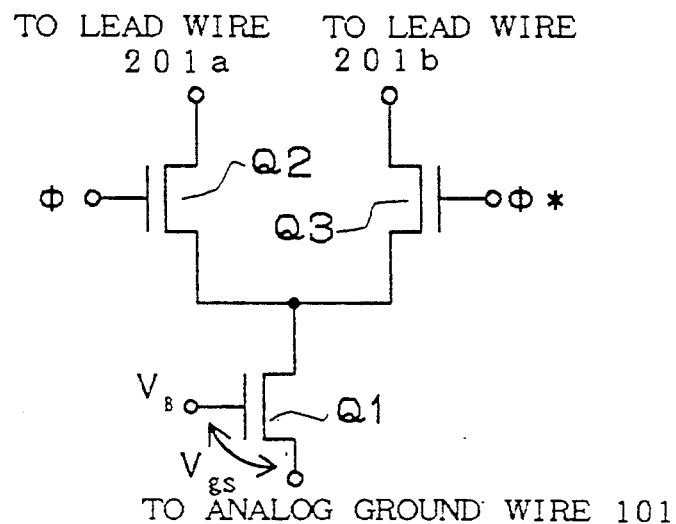
FIG. 2 is a circuit diagram showing the internal structure of each cell.

FIG. 2 shows an exemplary structure of the unit current source 20 and the changeover switch 21 in relation to the cell 1A. A transistor Q1 has a drain which is connected with sources of transistors Q2 and Q3 in common, and a source which is connected to the analog ground wire 101. The transistors Q2 and Q3 have gates which are supplied with complementary control signals $\phi$ and $\phi^*$ (hereinafter * represents logically inverted signals), and drains which are connected with the lead wires 201a and 201b. The transistors Q2 and Q3 define the changeover switch 21, and the transistor Q1 defines the unit current source 20.

A bias voltage $V_B$, which is applied to all cells in common, is applied to the gate of the transistor Q1, to control the value of a current fed by the transistor Q1 through potential difference $V_{gs}$. When the potential of the analog ground wire 101 is different, therefore, the values of the outputted currents are varied to cause a current distribution.

Figure 3:
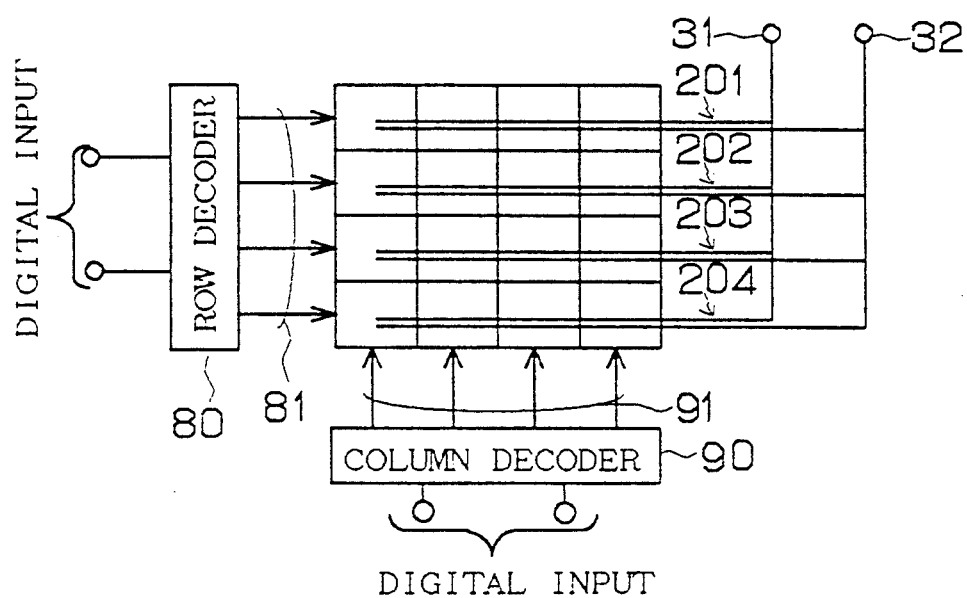
FIG. 3 schematically illustrates the overall structure of the first embodiment.

FIG. 3 illustrates the overall structure of the current cell matrix D-A converter according to the first embodiment of the present invention. While FIG. 3 shows the arrangement of the current source cells as a matrix of four rows and four columns for the purpose of simplification, the matrix of five rows and five columns shown in FIG. 1 is formed in a similar manner thereto.

Digital inputs, being contents of input digital codes, supplied to a row decoder 80 and a column decoder 90 are converted to row and column control signals 81 and 91 respectively, which are further converted to the control signals $\phi$ and $\phi^*$ to control the changeover switches 21, i.e., the operations of the transistors Q1 and Q2.

Referring again to FIG. 1, the analog ground wire 301 connects the left ends of the analog ground wires 102 and 104 to a pad 41. On the other hand, the analog ground wire 302 connects the right ends of the analog ground wires 101, 103 and 105 to another pad 42.

Figure 4A:
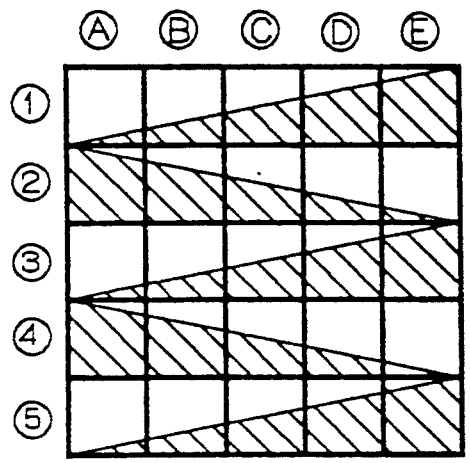
FIGS. 4A and 4B are explanatory diagrams showing current distributions of respective cells in the first embodiment.
Figure 31:
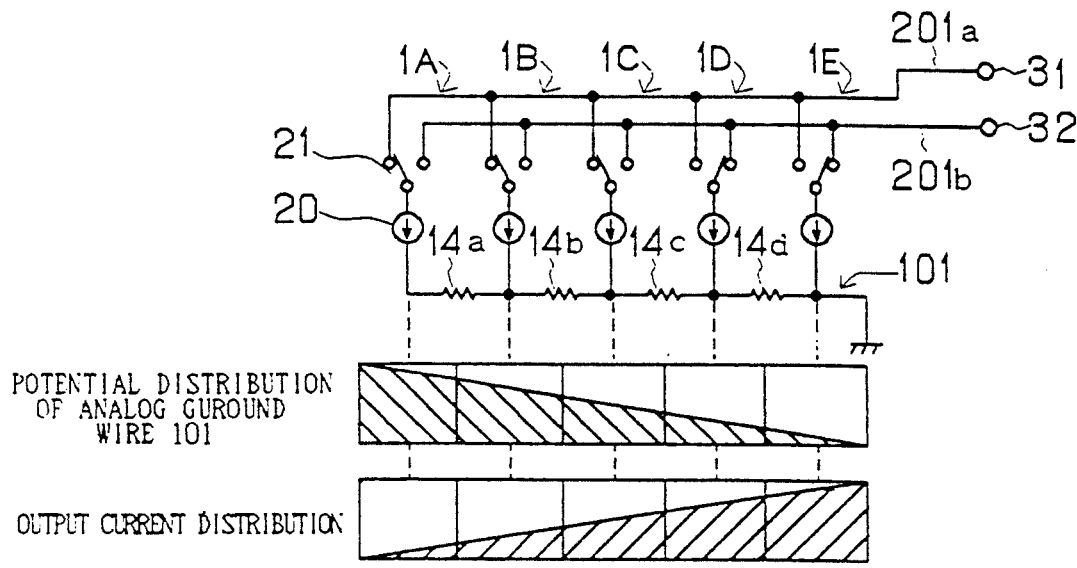
FIG. 31 is an equivalent circuit diagram showing the prior art.
Figure 32:
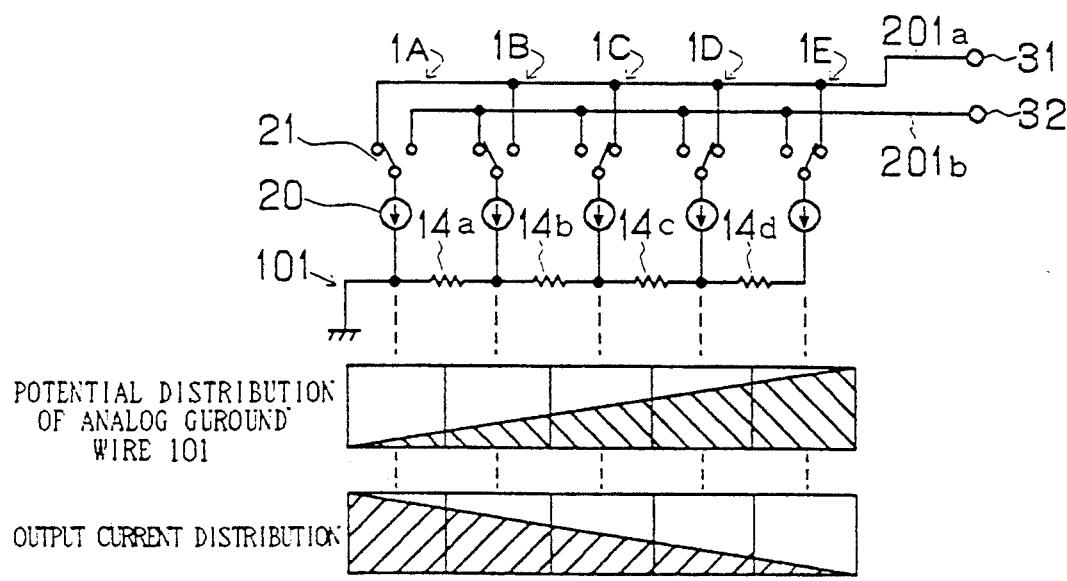
FIG. 32 is an equivalent circuit diagram showing the prior art.
Figure 33A:
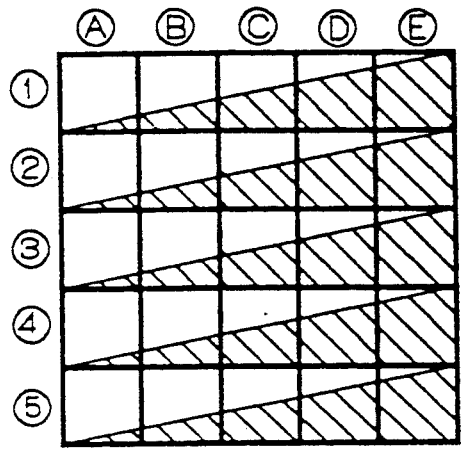
FIGS. 33A, 33B, 34A, and 34B are explanatory diagrams showing current distributions of respective cells in the prior art.
Figure 33B:
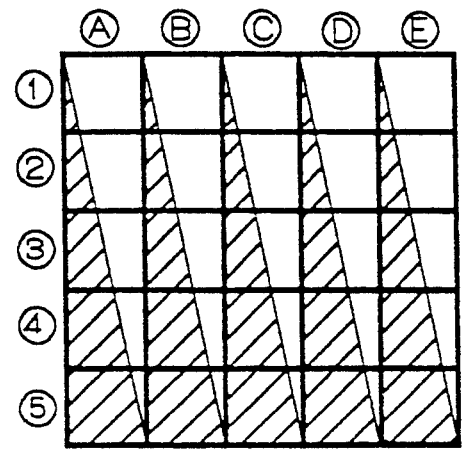

In the arrangement of the current source cells connected in the aforementioned manner, the currents are row-directionally distributed conceptually in inverse large-small relations as shown in FIG. 4A. This is because the current source cells 1A to 1E, 3A to 3E and 5A to 5E on the first, third and fifth rows have current distributions similar to that shown in FIG. 31, and the current source cells 2A to 2E and 4A to 4E on second and fourth rows have current distributions similar to that shown in FIG. 32 respectively.

In the analog ground wire 301, the analog ground wire 301a connecting the analog ground wire 102 with the pad 41 is closer to the pad 41 as compared with the other analog ground wire 301b connecting the analog ground wires 102 and 104 with each other. In the analog ground wire 302, on the other hand, the analog ground wire 302b connecting the analog ground wires 103 and 105 with each other is closer to the pad 42 as compared with the other analog ground wire 302a connecting the analog ground wires 101 and 103 with each other.

Figure 4B:
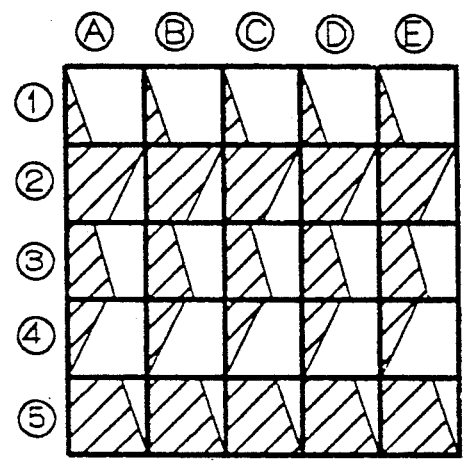

Due to ground wire resistances caused in the analog ground wires 301a, 301b, 302a and 302b, therefore, column-directional current distributions are conceptually illustrated as shown in FIG. 4B.

Figure 5A:
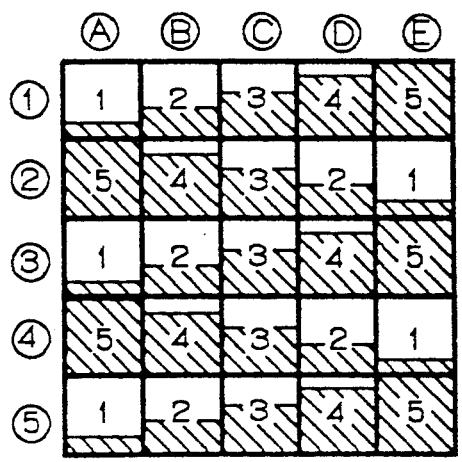
FIGS. 5A and 5B are explanatory diagrams showing current distributions of respective cells in the first embodiment.
Figure 5B:
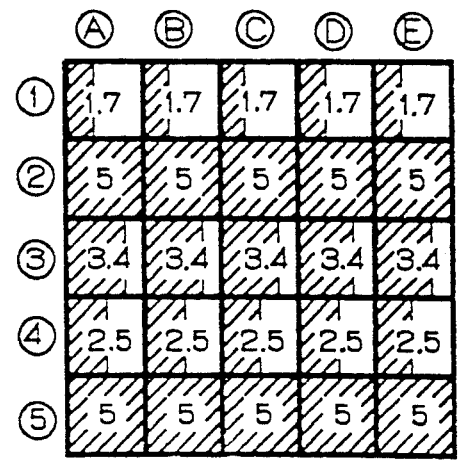

FIGS. 5A and 5B illustrate how the currents being fed by the unit current sources 20 of the respective cells differ from each other along the row and column directions, in correspondence to FIGS. 4A and 4B. Referring to FIGS. 5A and 5B, numerical values shown in frames represent the values of currents which are actually fed by the unit current sources 20 of the respective cells assuming that the unit current sources 20 feed currents of 5 when the ground wire resistances are zero.

Therefore, the values of currents fed by the unit current sources 20 of the respective cells when the same are selected are obtained by adding up the values shown in FIGS. 5A and 5B in the respective cells. FIG. 6 shows such values. Referring to FIG. 6, it is assumed that the unit current sources 20 feed currents of 10 when the ground wire resistances are zero.

In the D-A converter having the aforementioned structure, the analog ground wires 101, 103 and 105 and the analog ground wires 102 and 104 form current distributions in opposite row directions. Further, the analog ground wires 301 and 302 form current distributions in opposite column directions. Thus it is possible to cancel output current distributions appearing between the unit current sources and the current source arrays, thereby improving linearity of the analog outputs.

In more concrete terms, FIG. 7 illustrates in what order the cells are selected and connected to an output terminal 31 (or 32) as the values indicated by the input digital codes are increased in the matrix of the current source cells shown in FIG. 1. Referring to FIG. 7, numerals shown in rectangles indicating the respective cells represent the order of the cells selected as the values indicated by the input digital codes are increased. When an input digital code indicates a value of 3, for example, three current source cells 1A, 2A and 3A are selected.

In other words, the cells are selected in order of 1A, 2A, ..., 5A, 1B, 2B, ..., 5B, ..., 1E, 2E, ..., 5E as the values of the input digital codes are increased. Therefore, the currents fed to the output terminal 31(32) are increased a 2.7, 10, ..., 6, 3.7, 9, ..., 7, 6.7 ..., 10, as understood from FIG. 6.

Figure 8:
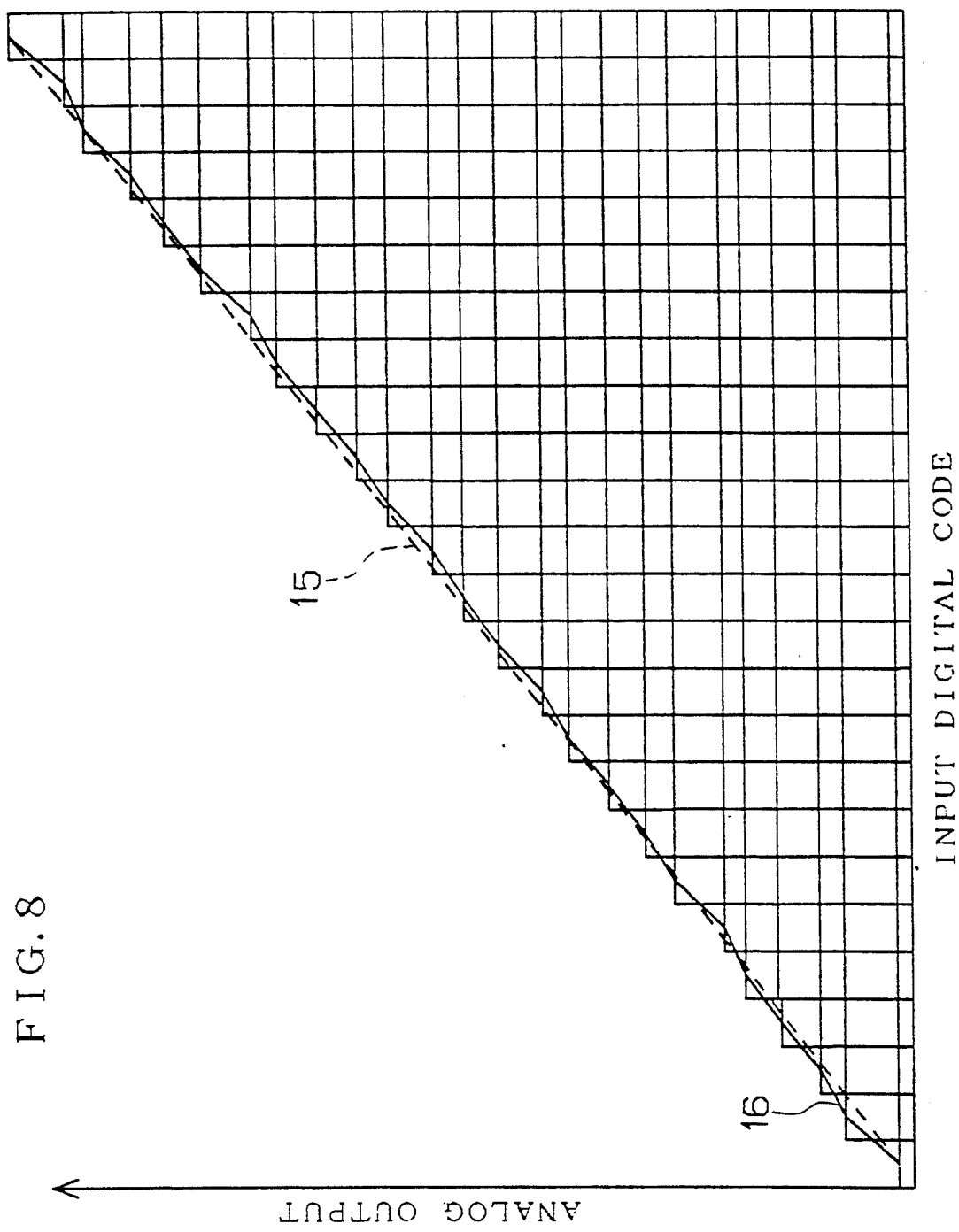
FIG. 8 is a graph for illustrating the operation of the first embodiment.

FIG. 8 is a graph of this. Vertical positions of respective rectangular blocks correspond to the values of the currents fed by the respective cells. It is understood that the analog outputs are so increased as the input digital codes are increased that actual outputs shown by a solid line 16 is curved substantially in the same manner as ideal outputs shown by a broken line 15, i.e., values proportionate to the input digital codes.

Figure 34A:
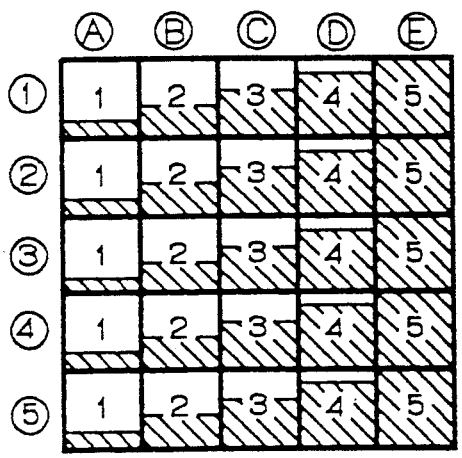
Figure 34B:
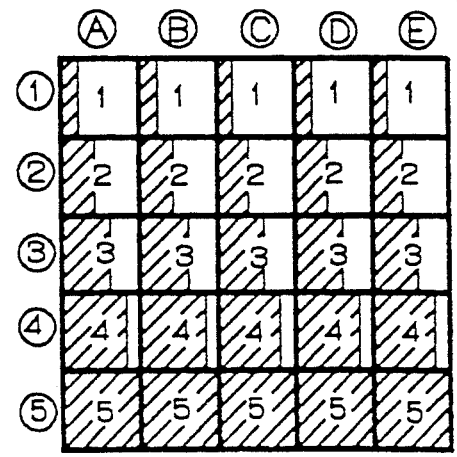

Compare this with the conventional case. In the conventional matrix of current source cells, currents fed by the unit current sources 20 of the cells when the same are selected are given as shown in FIG. 9 on the basis of FIG. 34. When the cells are selected in order of 1A, 2A, ..., 5A, 1B, 2B, ..., 5B, ..., 1E, 2E, ..., 5E along FIG. 7, currents fed to the output terminal 31 (or 32) are increased as 2, 3, ..., 6, 3, 4, ..., 7, ..., 6, 7, ..., 10.

Figure 10:
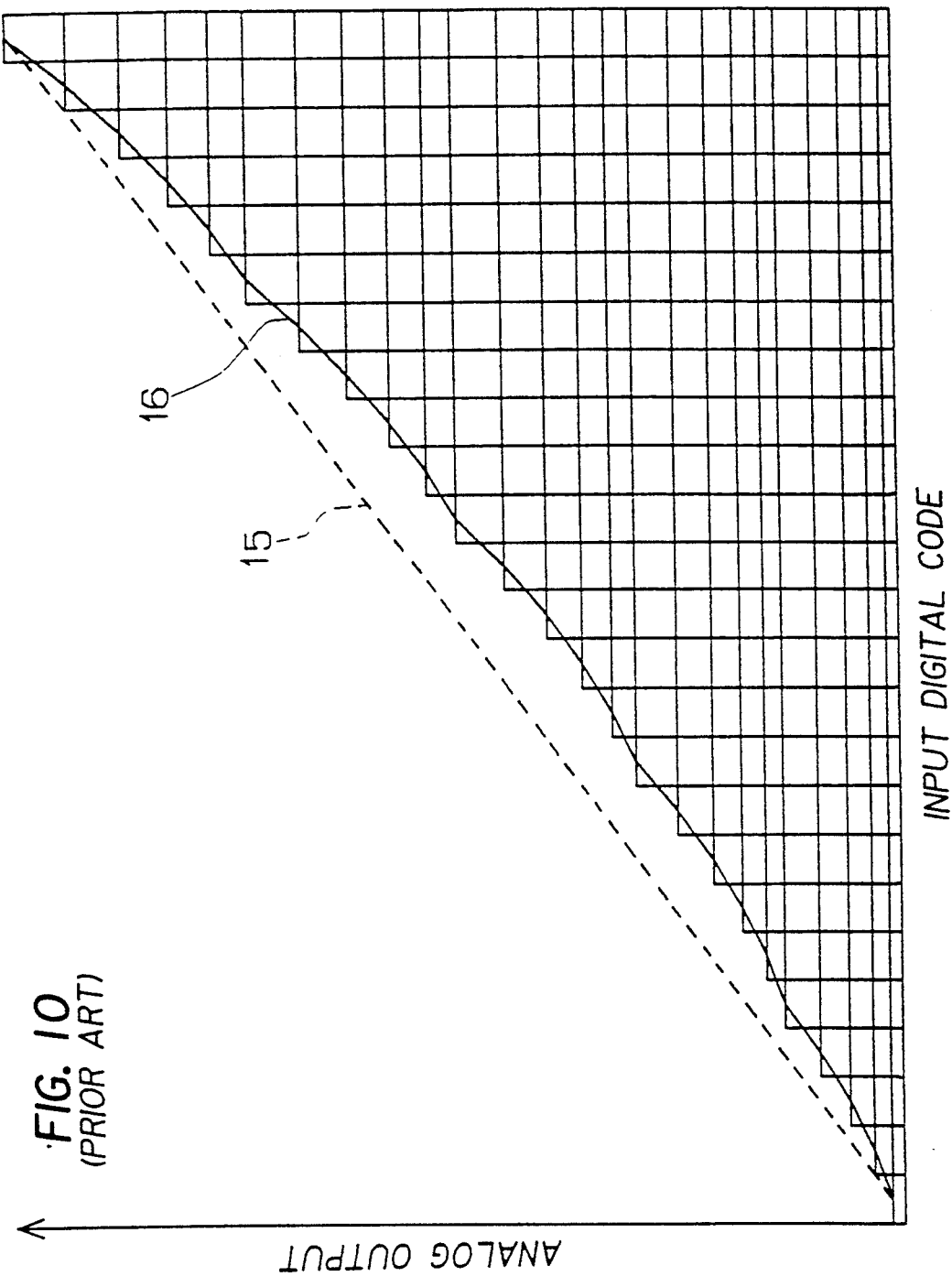
FIG. 10 is a graph for illustrating the operation of the prior art.

FIG. 10 is a graph of this. It is understood that actual outputs 16 are considerably mismatched with respect to ideal outputs 15, although the analog outputs are increased as the input digital codes are increased. In other words, it is understood that the first embodiment of the present invention is superior in linearity of D-A conversion to the conventional case.

The cells may be selected in order of various patterns, in addition to that shown in FIG. 7. FIGS. 11 to 18 show exemplary patterns. Relations between the input digital codes and the analog outputs, which are attained when the cells are selected in such selection order so that the current sources thereof are driven, are explained with reference to other embodiments as hereafter described.

Second Embodiment

Figure 19:
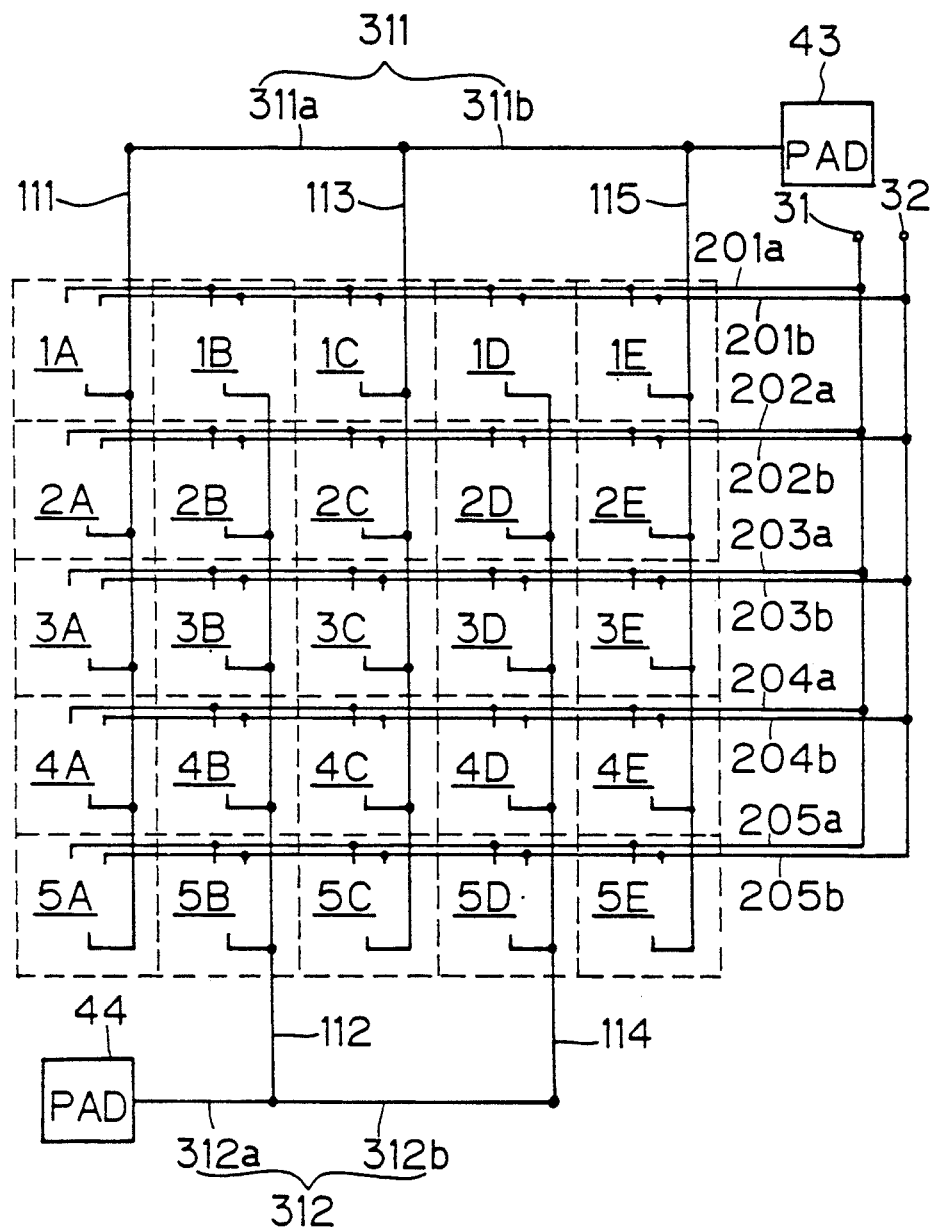
FIG. 19 is a block diagram showing a second embodiment of the present invention.

FIG. 19 schematically illustrates a matrix of current source cells forming a part of a current cell matrix D-A converter according to a second embodiment of the present invention.

Similarly to FIG. 1, unit current sources 20 and changeover switches 21 provided in respective current source cells 1A, 1B, ..., 5D, 5E which are arranged in five rows and five columns are omitted in order to clarify relations of connection between analog ground wires 111 to 115, 311 and 312 and lead wires 201a to 205a and 201b to 205b, and contours of the cells are shown by broken lines.

The analog ground wires 111 to 115 are respectively connected with first ends of the unit current sources 20 provided in the current source cells 1A to 5A, 1B to 5B, 1C to 5C, 1D to 5D and 1E to 5E, which are arranged in the column direction.

The analog ground wire 311 connects upper ends of the analog ground wires 111, 113 and 115 to a pad 43. On the other hand, the analog ground wire 312 connects lower ends of the analog ground wires 112 and 114 to another pad 44.

Figure 20A:
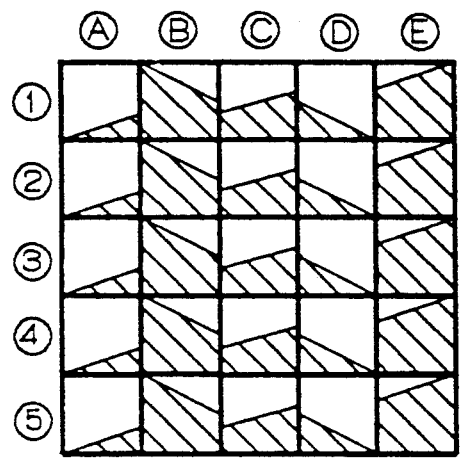
FIGS. 20A and 20B are explanatory diagrams showing current distributions of respective cells in the second embodiment.
Figure 20B:
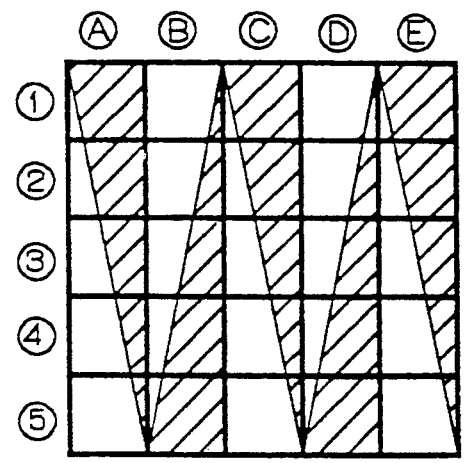

In the matrix of the current source cells connected in the aforementioned manner, column-directional current distributions conceptually have opposite large-small relations as shown in FIG. 20B.

In the analog ground wire 312, the analog ground wire 312a connecting the analog ground wire 112 with the pad 44 is closer to the pad 44 as compared with the analog ground wire 312b connecting the analog ground wires 112 and 114 with each other. In the analog ground wire 311, on the other hand, the analog ground wire 311b connecting the analog ground wires 113 and 115 with each other is closer to the pad 43 as compared with the anlog ground wire 311a connecting the analog ground wires 113 and 115 with each other.

Due to ground wire resistances caused in the analog ground wires 311a, 311b, 312a and 312b, therefore, row-directional current distributions are conceptually illustrated as shown in FIG. 20A.

Figure 21A:
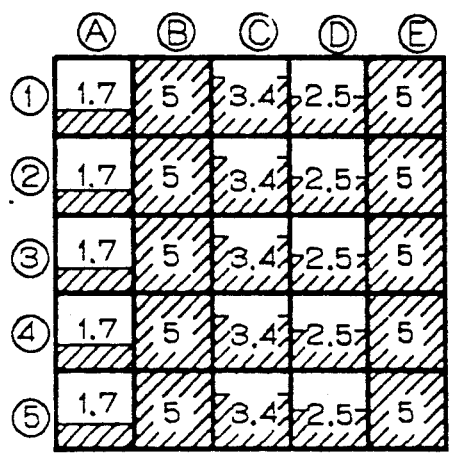
FIGS. 21A and 21B are explanatory diagrams showing current distributions of respective cells in the second embodiment.
Figure 21B:
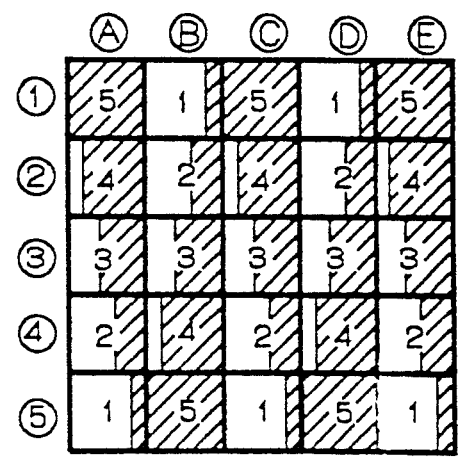

FIGS. 21A and 21B show how the values of currents fed by the unit current sources 20 of the respective cells differ from each other in the row and column directions, in correspondence to FIGS. 20A and 20B. Referring to FIGS. 21A and 21B, numerical values shown in frames represent the values of currents which are actually fed by the unit current sources 20 of the respective cells assuming that the unit current sources 20 feed currents of 5 when the ground wire resistances are zero.

In the structure of the second embodiment, the rows and columns of the first embodiment are replaced by each other, and this also applies to the current distributions. In other words, FIGS. 4A and 4B correspond to FIGS. 20B and 20A respectively, while FIGS. 5A and 5B correspond to FIGS. 21B and 21A respectively.

FIG. 22 shows the currents fed by the unit current sources 20 of the respective cells when the same are selected. These values are obtained by adding up the values shown in FIGS. 21A and 21B in the respective cells. Referring to FIG. 22, it is assumed that the unit current sources 20 feed currents of 10 when the ground wire resistances are zero.

In relation to the matrix of the current source cells formed as shown in FIG. 19, consider that the cells are selected in the order shown in FIG. 12 to be connected to an output terminal 31 (or 32) as the values of input digital codes are increased.

Namely, the cells are selected in the order of 1A, 1B, ..., 1E, 2A, 2B, ..., 2E, ..., 5A, 5B, ..., 5E as the values of the input digital codes are increased. Therefore, the currents fed to the output terminal 31 (or 32) are increased as 6.7, 6, ..., 10, 5.7, 7, ..., 9, ..., 2.7, 10, ..., 6, as understood from FIG. 22.

Figure 23:
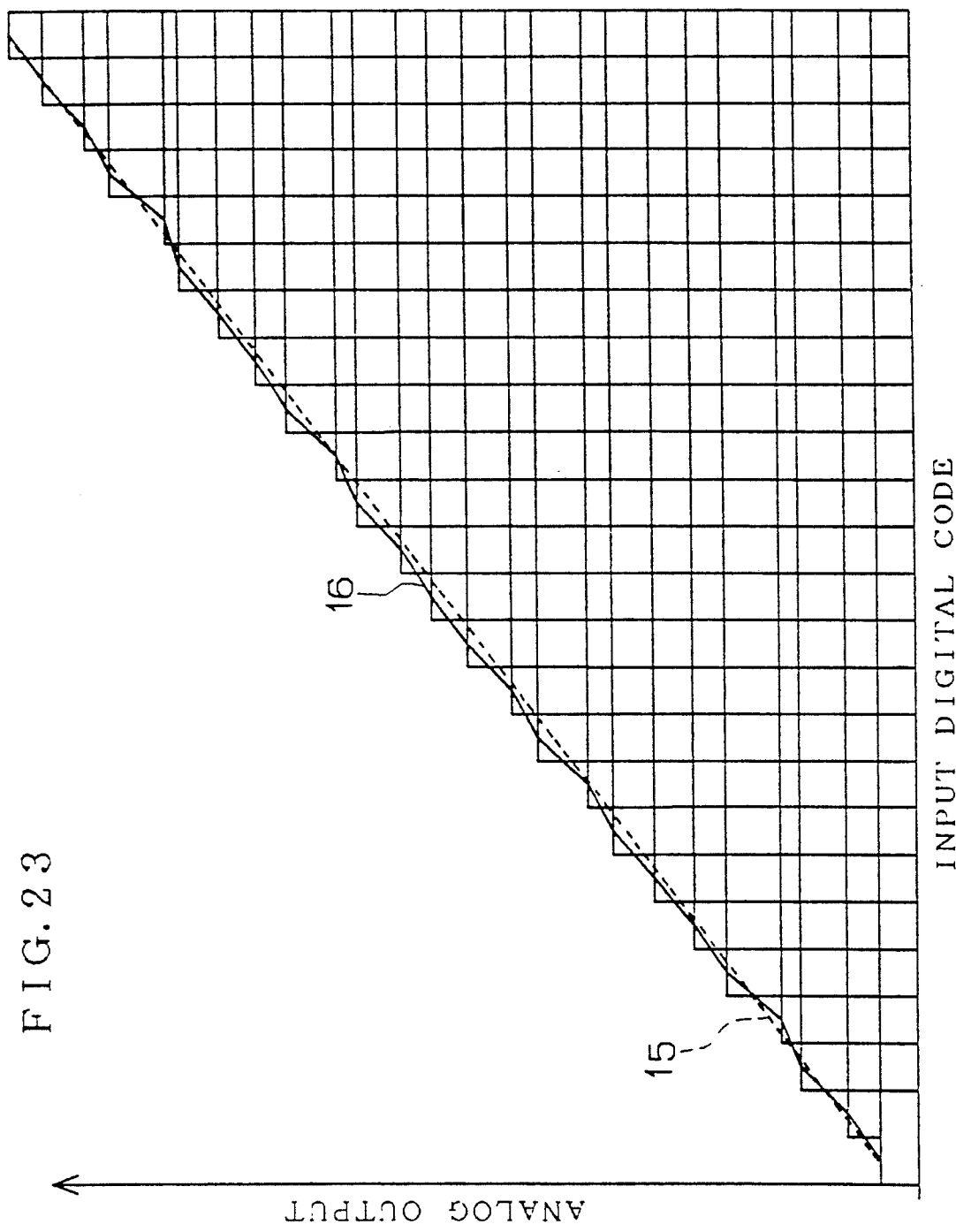
FIG. 23 is a graph for illustrating the operation of the second embodiment.

FIG. 23 is a graph of this. Similarly to FIG. 8, the vertical positions of respective rectangular blocks correspond to the values of the currents fed by the respective cells. The analog outputs are so increased as the input digital codes are increased, that actual outputs 15 are curved substantially in the same manner as ideal outputs 15, i.e., values proportionate to the input digital codes.

When the cells are selected in the order of FIG. 12 in the conventional matrix of current source cells, on the other hand, the currents fed to the output terminal 31 (or 32) are increased as 2, 3, ..., 6, 3, 4, ..., 7, ..., 6, 7, ..., 10, and the analog outputs thereof are shown by the same graph as FIG. 8.

Thus, it is understood that the second embodiment of the present invention is also improved in linearlity of D-A conversion as compared with the conventional case.

Third Embodiment

Figure 24:
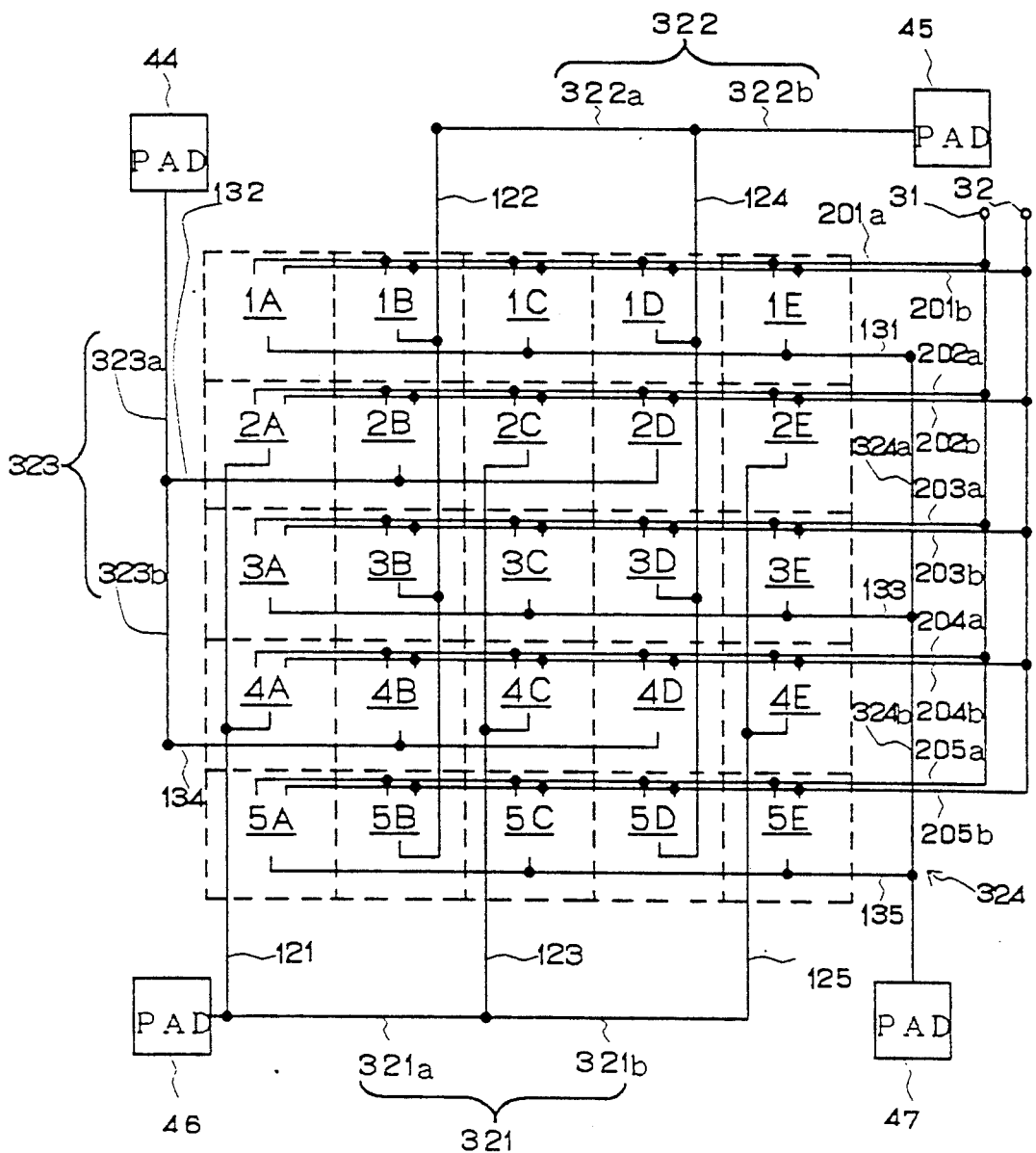
FIG. 24 is a block diagram showing a third embodiment of the present invention.

FIG. 24 schematically illustrates a matrix of current source cells forming a part of a current cell matrix D-A converter according to a third embodiment of the present invention.

Similarly to FIG. 1, unit current sources 20 and changeover switches 21 provided in respective current source cells 1A, 1B, ..., 5D, 5E which are arranged in five rows and five columns are omitted in order to clarify relations of connection between analog ground wires 121 to 125, 131 to 135 and 321 to 325 and lead wires 201a to 205a and 201b to 205b, and contours of the cells are shown by broken lines.

The analog ground wires 121 to 125 are respectively connected with first ends of the unit current sources 20 provided in the current source cells 2A, 4A, 1B, 3B, 5B, 2C, 4C, 1D, 3D, 5D, 2E and 4E.

The analog ground wires 131 to 135 are respectively connected with first ends of the unit current sources 20 provided in the current source cells 1A, 1C, 1E, 2B, 2D, 3A, 3C, 3E, 4B, 4D, 5A, 5C and 5E.

The analog ground wire 321 connects lower ends of the analog ground wires 121, 123 and 125 to a pad 46. On the other hand, the analog ground wire 322 connects upper ends of the analog ground wires 122 and 124 to another pad 45.

The analog ground wire 324 connects right ends of the analog ground wires 131, 133 and 135 to still another pad 47. The analog ground wire 323 connects left ends of the analog ground wires 132 and 134 to a further pad 44.

In the matrix of the current source cells connected in the aforementioned manner, the potential distributions are attained as compositions of the potential distributions shown in the first and second embodiments.

In the analog ground wire 322, the analog ground wire 322b connecting the analog ground wire 124 with the pad 45 is closer to the pad 45 as compared with the analog ground wire 322a connecting the analog ground wires 122 and 124 with each other. In the analog ground wire 321, the analog ground wire 321a connecting the analog ground wires 121 and 123 with each other is closer to the pad 46 as compared with the analog ground wire 321b connecting the analog ground wires 123 and 125 with each other.

In the analog ground wire 323, the analog ground wire 323a connecting the analog ground wire 132 with the pad 44 is closer to the pad 44 as compared with the analog ground wire 323b connecting the analog ground wires 132 and 134 with each other. In the analog ground wire 324, the analog ground wire 324b connecting the analog ground wires 133 and 135 with each other is closer to the pad 47 as compared with the analog ground wire 324a connecting the analog ground wires 131 and 133 with each other.

Due to ground wire resistances caused in the analog ground wires 121 to 125, 131 to 135 and 321 to 324, therefore, row-directional and column-directional current distributions are illustrated as shown in FIGS. 25A and 25B respectively.

FIG. 26 shows currents fed by the unit current sources 20 provided in the cells when the same are selected. These values are obtained by adding up the values shown in FIGS. 25A and 25B in the respective cells. Referring to FIG. 26, it is assumed that the unit current sources 20 feed currents of 10 when the ground wire resistances are zero.

In relation to the matrix of the current source cells formed as shown in FIG. 24, consider that the cells are selected in the order shown in FIG. 13 and connected to an output terminal 31 (or 32) as the values indicated by input digital codes are increased.

Namely, the cells are selected in order of 1A, 2A, 5A, 1E, 2E, ..., 5E, 1B, 2B, ..., 5B, 1D, 2D, ..., 5D, 1C, 2C, ..., 2E as the values indicated by the input digital codes are increased. Therefore, currents fed to the output terminal 31 (or 32) are increased as 3.4, 7.5, ..., 6.7 6.7, 4.2, ..., 10, 7.5, 10, ..., 4.4, 10, 7.5, ..., 6.7, 5.1, 5.9, ..., 8.4 as understood from FIG. 26.

Figure 27:
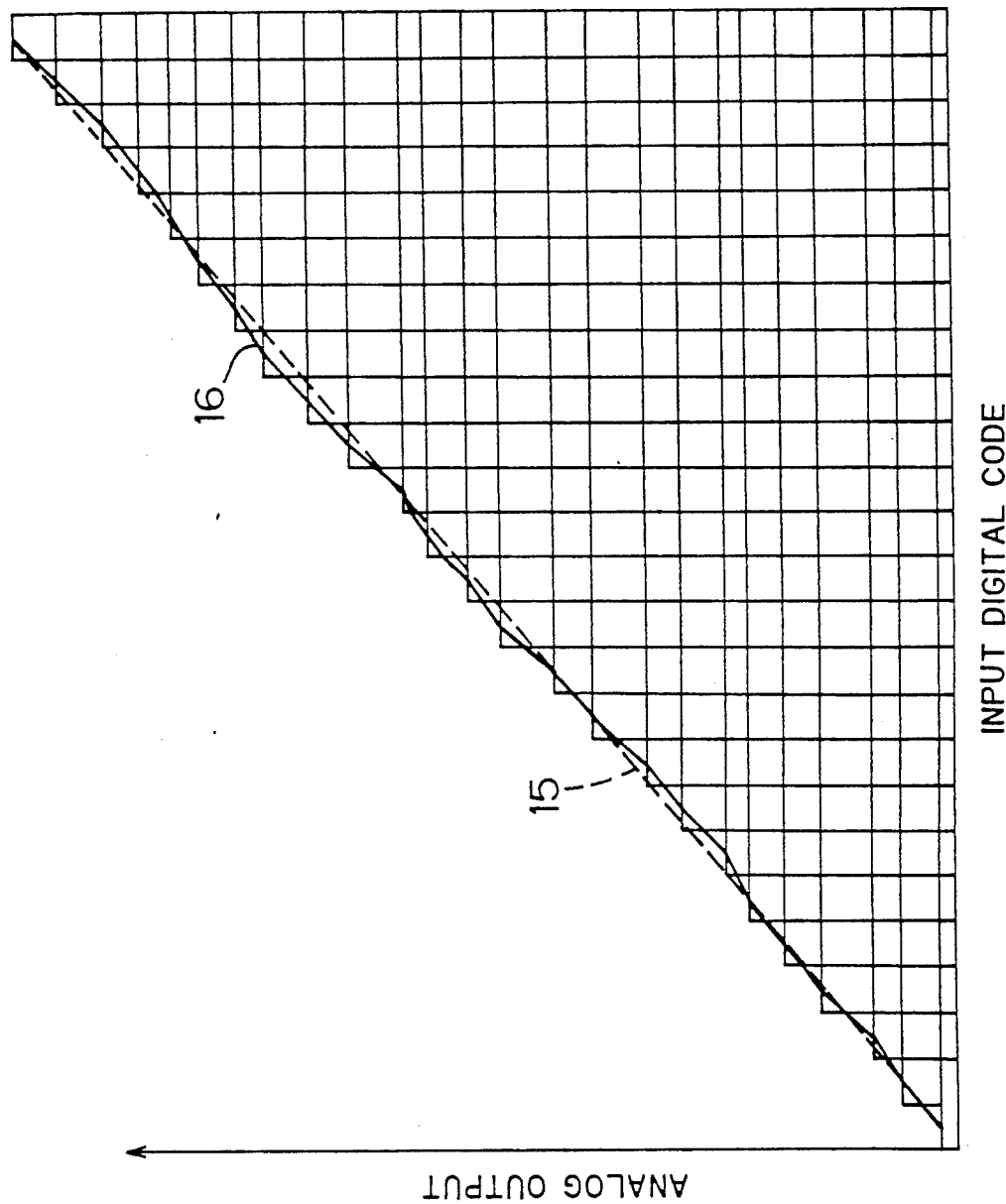
FIG. 27 is a graph showing the operation of the third embodiment.

FIG. 27 is a graph of this. Similarly to FIG. 8, vertical positions of respective rectangular blocks correspond to values of the currents fed by the respective cells. The analog outputs are so increased as the input digital codes are increased, that actual outputs 16 are curved substantially in the same manner as ideal outputs 15, i.e., values proportionate to the input digital codes.

Figure 28:
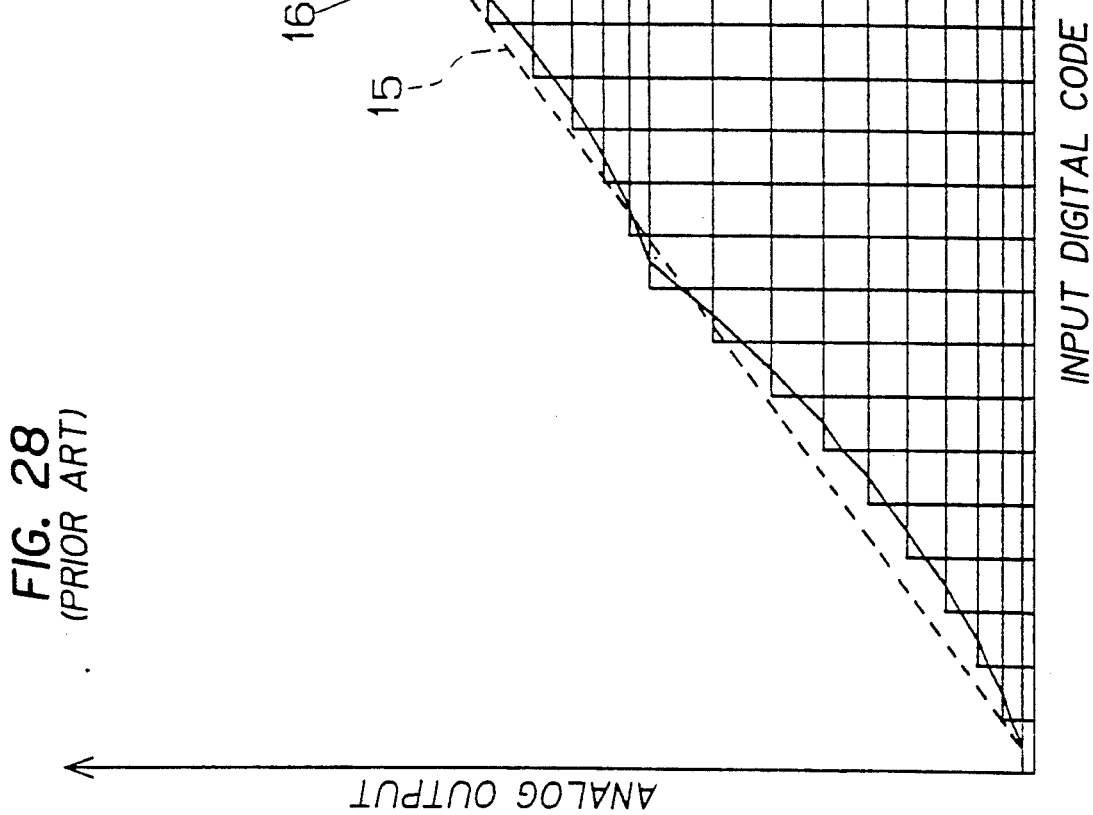
FIG. 28 is a graph for illustrating the operation of the prior art.
Figure 29:
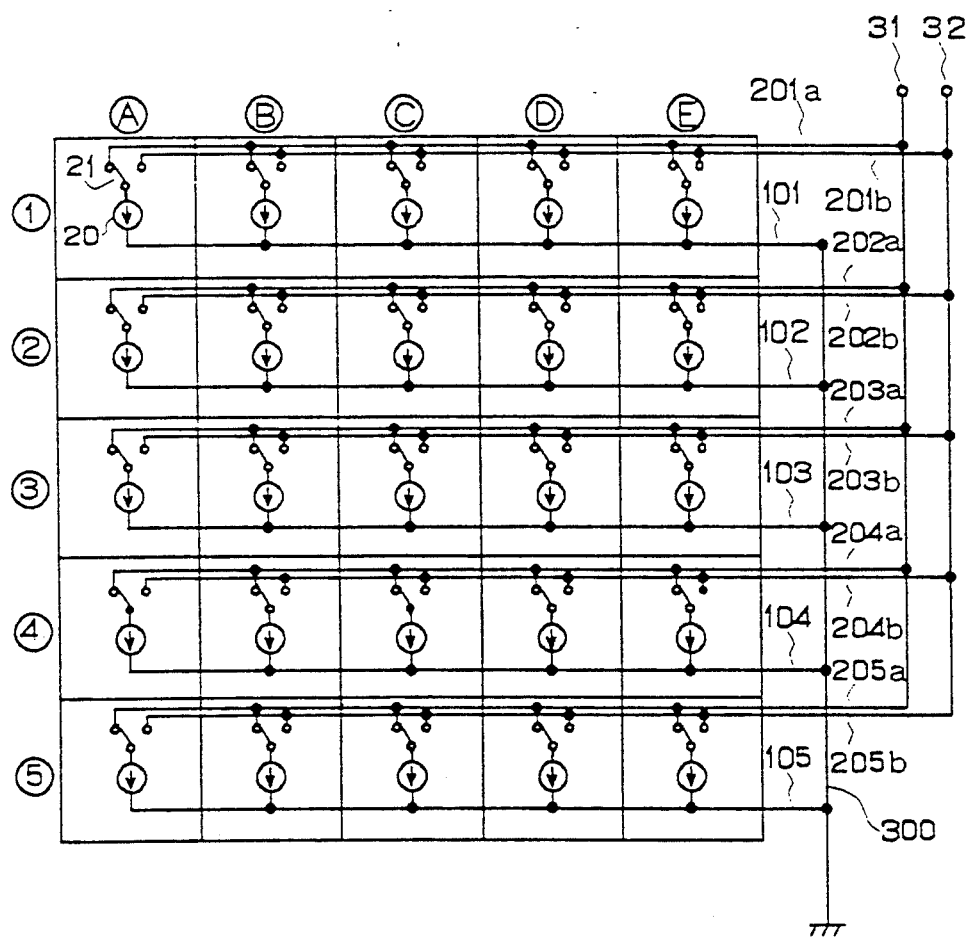
FIG. 29 is a block diagram showing the prior art.
Figure 30:
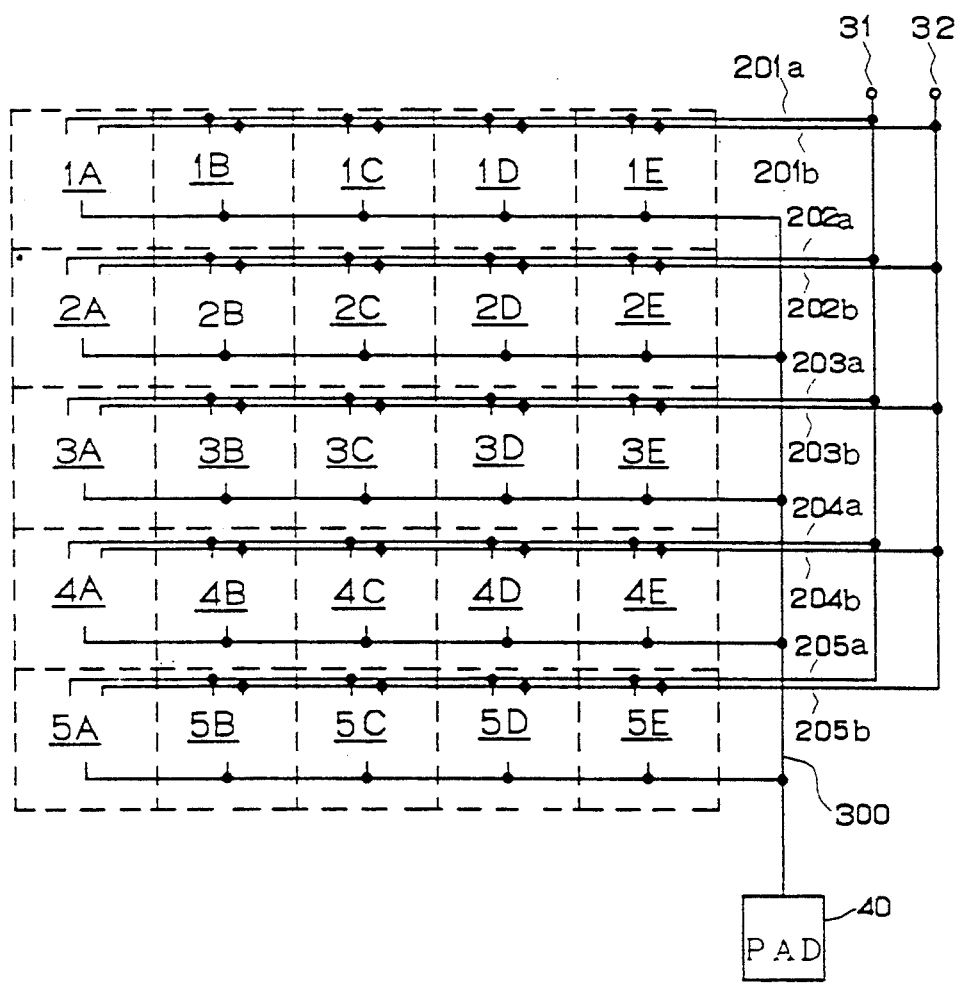
FIG. 30 is a block diagram showing the prior art.

Also when the cells are selected in the order shown in FIG. 13 in the conventional matrix of current source cells, the currents flowing to the output terminal 31 (or 32) are increased as 2, 3, ..., 6, 6, 7, ..., 10, 3, 4, ..., 7, 5, 6, ..., 9, 4, 5, ..., 8 as understood from FIG. 9, and the analog outputs thereof are as shown in FIG. 28.

Thus, it is understood that the third embodiment of the present invention is also improved in linearity of D-A conversion as compared with the conventional case.

The selection orders shown in FIGS. 11 to 18 provide the effects of the present invention in all of the aforementioned embodiments. It is not requisite to employ the selection orders shown in FIGS. 7, 12 and 13 for the first to third embodiments.

Although the current source cells are arranged in the matrix of five rows and five columns in each of the aforementioned embodiments, the present invention is not restricted to this but can be similarly carried out also when the current source cells are arranged in a matrix of N rows and N columns, to attain the effect thereof.

While the invention has been shown and described in detail, the foregoing description is in all aspects illustrative and not restrictive. It is therefore understood that numerous modifications and variations can be devised without departing from the scope of the invention.

We claim:

1. A D-A converter comprising:
   (a) a plurality of complementary output cells being arranged in the form of a matrix, each said complementary output cell having:
   (a-1) a changeover switch having a common terminal and first and second terminals, and
   (a-2) a unit current source having a first end being connected to said common terminal and a second end;
   (b) a plurality of first analog lines connecting prescribed ones of said second ends of said unit current sources in common;
   (c) a pair of second analog lines connecting prescribed ones of said first analog lines to fixed potentials in common;
   (d) first and second output current terminals being connected to all said first and second terminals of said changeover switches respectively; and
   (e) a decoder receiving a digital signal and generating a control signal for controlling switching of said changeover switches on the basis of said digital signal and successively working said complementary output cells one by one with increase of a value indicated by said digital signal,
   (b-1) each said first analog lines connecting all said second ends of said unit current sources of said complementary output cells being row-directionally arranged in each row,
   (b-2) adjacent ones of said first analog lines being connected to different ones of said second analog lines,
   (c-1) said pair of second analog lines extending on the opposite side of said complementary output cells in different directions being substantially parallel to the column direction.

2. A D-A converter in accordance with claim 1, wherein
   a bias voltage is supplied to said unit current sources so that said unit current sources generate constant currents on the basis of said bias voltage,
   a common said bias voltage being applied to all said unit current sources.

3. A D-A converter in accordance with claim 2, wherein
   each said unit current source comprises:
   (a-2-1) a first transistor having a control electrode being supplied with said bias voltage and first and second current electrodes being connected to said first and second ends respectively.

4. A D-A converter in accordance with claim 3, wherein
   each said changeover switch comprises:
   (a-1-1) a second transistor having a first current electrode being connected to said first terminal, a control electrode being supplied with said control signal, and a second current electrode being connected to said common terminal, and
   (a-1-2) a third transistor having a first current electrode being connected to said second terminal, a control electrode being supplied with said control signal, and a second current electrode being connected to said common terminal.

5. A D-A converter in accordance with claim 1, wherein
   said fixed potentials are ground potentials.

6. A D-A converter in accordance with claim 1, further comprising:
   a plurality of first signal lines connecting all said first terminals of said changeover switches of said complementary output cells being row-directionally arranged in each row to said first output current terminal in common, and
   a plurality of second signal lines connecting all said second terminals of said changeover switches of said complementary output cells being row-directionally arranged in each row.

7. A D-A converter in accordance with claim 1, wherein
said decoder drives said complementary output cells, with increase of the value being indicated by said digital signal,
(e-1) from the first column toward the last column, and
(e-2) successively from the first row toward the last row in each column.

8. A D-A converter in accordance with claim 1, wherein
said decoder drives said complementary output cells, with increase of the value being indicated by said digital signal,
(e-3) from the first row toward the last row, and
(e-4) successively from the first column toward the last column in each row.

9. A D-A converter in accordance with claim 1, wherein
said decoder drives said complementary output cells, with increase of the value being indicated by said digital signal,
(e-5) alternately from the outermost row toward the innermost row in such order as the first row, the last row, the second row, ..., and
(e-6) successively from the first column toward the last column in each row.

10. A D-A converter in accordance with claim 1, wherein
said decoder drives said complementary output cells, with increase of the value being indicated by said digital signal,
(e-7) alternately from the outermost column toward the innermost column in such order as the first column, the last column, the second column, ..., and
(e-8) successively from the first row toward the last row in each column.

11. A D-A converter in accordance with claim 1, wherein
said decoder drives said complementary output cells, with increase of the value being indicated by said digital signal,
(e-9) alternately from the outermost column toward the innermost column in such order as the first column, the last column, the second column, ..., and
(e-10) vertically alternately from the innermost row toward the outermost row in each column.

12. A D-A converter in accordance with claim 1, wherein
said decoder drives said complementary output cells, with increase of the value being indicated by said digital signal,
(e-11) alternately from the outermost row toward the innermost row in such order as the first row, the last row, the second row, ..., and
(e-12) horizontally alternately from the innermost column toward the outermost column in each row.

13. A D-A converter in accordance with claim 1, wherein
said decoder
(e-13) divides said complementary output cells into a plurality of ring-shaped elements being concentric about the center of said matrix formed by said complementary output cells, and
(e-14) drives said complementary output cells successively symmetrically about said center, serving as a symmetrical point, with increase of the value being indicated by said digital signal.

14. A D-A converter in accordance with claim 1, wherein
said decoder drives said complementary output cells, with increase of the value being indicated by said digital signal,
(e-15) successively spirally from the center of said matrix being formed by said complementary output cells toward the outer side.

15. A D-A converter in accordance with claim 1, wherein
said decoder drives said complementary output cells, with increase of the value being indicated by said digital signal,
(e-16) successively spirally from the outer side of said matrix being formed by said complementary output cells toward the center.

16. A D-A converter comprising:
(a) a plurality of complementary output cells being arranged in the form of a matrix, each said complementary output cell having:
(a-1) a changeover switch having a common terminal and first and second terminals, and
(a-2) a unit current source having a first end being connected to said common terminal and a second end;
(b) a plurality of first analog lines-connecting prescribed ones of said second ends of said unit current sources in common;
(c) a pair of second analog lines connecting prescribed ones of said first analog lines to fixed potentials in common;
(d) first and second output current terminals being connected to all said first and second terminals of said changeover switches respectively; and
(e) a decoder receiving a digital signal and generating a control signal for controlling switching of said changeover switches on the basis of said digital signal and successively working said complementary output cells one by one with increase of a value indicated by said digital signal,
(b-1) each said first analog lines connecting all said second ends of said unit current sources of said complementary output cells being column-directionally arranged in each column,
(b-2) adjacent ones of said first analog lines being connected to different ones of said second analog lines,
(c-1) said pair of second analog lines extending on the opposite side of said complementary output cells in different directions being substantially parallel to the row direction.

17. A D-A converter in accordance with claim 16, wherein
a bias voltage is supplied to said unit current sources so that said unit current sources generate constant currents on the basis of said bias voltage,
a common said bias voltage being applied to all said unit current sources.

18. A D-A converter in accordance with claim 17, wherein
each said unit current source comprises:
(a-2-1) a first transistor having a control electrode being supplied with said bias voltage and first and second current electrodes being connected to said first and second ends respectively.

19. A D-A converter in accordance with claim 18, wherein each said changeover switch comprises:
(a-1-1) a second transistor having a first current electrode being connected to said first terminal, a control electrode being supplied with said control signal, and a second current electrode being connected to said common terminal, and
(a-1-2) a third transistor having a first current electrode being connected to said second terminal, a control electrode being supplied with said control signal, and a second current electrode being connected to said common terminal.

20. A D-A converter in accordance with claim 16, wherein said fixed potentials are ground potentials.

21. A D-A converter in accordance with claim 16, further comprising:

a plurality of first signal lines connecting all said first terminals of said changeover switches of said complementary output cells being row-directionally arranged in each row to said first output current terminal in common, and
a plurality of second signal lines connecting all said second terminals of said changeover switches of said complementary output cells being row-directionally arranged in each row.

22. A D-A converter in accordance with claim 16, wherein said decoder drives said complementary output cells, with increase of the value being indicated by said digital signal,
(e-1) from the first column toward the last column, and
(e-2) successively from the first row toward the last row in each column.

23. A D-A converter in accordance with claim 16, wherein said decoder drives said complementary output cells, with increase of the value being indicated by said digital signal,
(e-3) from the first row toward the last row, and
(e-4) successively from the first column toward the last column in each row.

24. A D-A converter in accordance with claim 16, wherein said decoder drives said complementary output cells, with increase of the value being indicated by said digital signal,
(e-5) alternately from the outermost row toward the innermost row in such order as the first row, the last row, the second row, . . . , and
(e-6) successively from the first column toward the last column in each row.

25. A D-A converter in accordance with claim 16, wherein said decoder drives said complementary output cells, with increase of the value being indicated by said digital signal,
(e-7) alternately from the outermost column toward the innermost column in such order as the first column, the last column, the second column, . . . , and
(e-8) successively from the first row toward the last row in each column.

26. A D-A converter in accordance with claim 16, wherein said decoder drives said complementary output cells, with increase of the value being indicated by said digital signal,
(e-9) alternately from the outermost column toward the innermost column in such order as the first column, the last column, the second column, . . . , and
(e-10) vertically alternately from the innermost row toward the outermost row in each column.

27. A D-A converter in accordance with claim 16, wherein said decoder drives said complementary output cells, with increase of the value being indicated by said digital signal,
(e-11) alternately from the outermost row toward the innermost row in such order as the first row, the last row, the second row, . . . , and
(e-12) horizontally alternately from the innermost column toward the outermost column in each row.

28. A D-A converter in accordance with claim 16, wherein said decoder
(e-13) divides said complementary output cells into a plurality of ring-shaped elements being concentric about the center of said matrix formed by said complementary output cells, and
(e-14) drives said complementary output cells successively symmetrically about said center, serving as a symmetrical point, with increase of the value being indicated by said digital signal.

29. A D-A converter in accordance with claim 16, wherein said decoder drives said complementary output cells, with increase of the value being indicated by said digital signal,
(e-15) successively spirally from the center of said matrix being formed by said complementary output cells toward the outer side.

30. A D-A converter in accordance with claim 16, wherein said decoder drives said complementary output cells, with increase of the value being indicated by said digital signal,
(e-16) successively spirally from the outer side of said matrix being formed by said complementary output cells toward the center.

31. A D-A converter comprising:
(a) a plurality of complementary output cells being arranged in the form of a matrix, each said complementary output cell having:
(a-1) a changeover switch having a common terminal and first and second terminals, and
(a-2) a unit current source having a first end being connected to said common terminal and a second end;
(b) a plurality of first and second analog lines connecting prescribed ones of said second ends of said unit current sources in common;
(c) a pair of third analog lines connecting prescribed ones of said first analog lines to fixed potentials in common and a pair of fourth analog lines connecting prescribed ones of said second analog lines to fixed potentials in common;
(d) first and second output current terminals being connected to all said first and second terminals of said changeover switches respectively; and
(e) a decoder receiving a digital signal and generating a control signal for controlling switching of said changeover switches on the basis of said digital signal and successively working said complementary output cells one by one with increase of a value indicated by said digital signal, said first analog lines (b-1) connecting all said second ends of said unit current sources of said complementary output cells belonging to odd columns in common in each odd row, while (b-2) connecting all said second ends of said unit current sources of said complementary output cells belonging to even columns in common in each even row, said second analog lines (b-3) connecting all said second ends of said unit current sources of said complementary output cells belonging to even rows in common in each odd column, while (b-4) connecting all said second ends of said unit current sources of said complementary output cells belonging to odd rows in common in each even column, (c-1) adjacent ones of said first analog lines being connected to different ones of said third analog lines, (c-2) said pair of third analog lines extending on the opposite side of said complementary output cells in different directions substantially parallel to the column direction, (c-3) adjacent ones of said second analog lines being connected to different ones of said fourth analog lines, (c-4) said pair of fourth analog lines extending on the opposite side of said complementary output cells in different directions substantially parallel to the row direction.

32. A D-A converter in accordance with claim 31, wherein a bias voltage is supplied to said unit current sources so that said unit current sources generate constant currents on the basis of said bias voltage, a common said bias voltage being applied to all said unit current sources.

33. A D-A converter in accordance with claim 32, wherein each said unit current source comprises:

(a-2-1) a first transistor having a control electrode being supplied with said bias voltage and first and second current electrodes being connected to said first and second ends respectively.

34. A D-A converter in accordance with claim 33, wherein each said changeover switch comprises:

(a-1-1) a second transistor having a first current electrode being connected to said first terminal, a control electrode being supplied with said control signal, and a second current electrode being connected to said common terminal, and (a-1-2) a third transistor having a first current electrode being connected to said second terminal, a control electrode being supplied with said control signal, and a second current electrode being connected to said common terminal.

35. A D-A converter in accordance with claim 31, wherein said fixed potentials are ground potentials.

36. A D-A converter in accordance with claim 31, further comprising:

a plurality of first signal lines connecting all said first terminals of said changeover switches of said complementary output cells being row-directionally arranged in each row to said first output current terminal in common, and a plurality of second signal lines connecting all said second terminals of said changeover switches of said complementary output cells being row-directionally arranged in each row.

37. A D-A converter in accordance with claim 31, wherein said decoder drives said complementary output cells, with increase of the value being indicated by said digital signal, (e-1) from the first column toward the last column, and (e-2) successively from the first row toward the last row in each column.

38. A D-A converter in accordance with claim 31, wherein said decoder drives said complementary output cells, with increase of the value being indicated by said digital signal, (e-3) from the first row toward the last row, and (e-4) successively from the first column toward the last column in each row.

39. A D-A converter in accordance with claim 31, wherein said decoder drives said complementary output cells, with increase of the value being indicated by said digital signal, (e-5) alternately from the outermost row toward the innermost row in such order as the first row, the last row, the second row, . . . , and (e-6) successively from the first column toward the last column in each row.

40. A D-A converter in accordance with claim 31, wherein said decoder drives said complementary output cells, with increase of the value being indicated by said digital signal, (e-7) alternately from the outermost column toward the innermost column in such order as the first column, the last column, the second column, . . . , and (e-8) successively from the first row toward the last row in each column.

41. A D-A converter in accordance with claim 31, wherein said decoder drives said complementary output cells, with increase of the value being indicated by said digital signal, (e-9) alternately from the outermost column toward the innermost column in such order as the first column, the last column, the second column, . . . , and (e-10) vertically alternately from the innermost row toward the outermost row in each column.

42. A D-A converter in accordance with claim 31, wherein said decoder drives said complementary output cells, with increase of the value being indicated by said digital signal, (e-11) alternately from the outermost row toward the innermost row in such order as the first row, the last row, the second row, . . . , and (e-12) horizontally alternately from the innermost column toward the outermost column in each row.

43. A D-A converter in accordance with claim 31, wherein said decoder (e-13) divides said complementary output cells into a plurality of ring-shaped elements being concentric about the center of said matrix formed by said complementary output cells, and (e-14) drives said complementary output cells successively symmetrically about said center, serving as a symmetrical point, with increase of the value being indicated by said digital signal.

44. A D-A converter in accordance with claim 31, wherein said decoder drives said complementary output cells, with increase of the value being indicated by said digital signal, (e-15) successively spirally from the center of said matrix being formed by said complementary output cells toward the outer side.

45. A D-A converter in accordance with claim 31, wherein said decoder drives said complementary output cells, with increase of the value being indicated by said digital signal, (e-16) successively spirally from the outer side of said matrix being formed by said complementary output cells toward the center.

* * * * *

UNITED STATES PATENT AND TRADEMARK OFFICE
CERTIFICATE OF CORRECTION

PATENT NO. : 5,327,134
DATED : July 5, 1994
INVENTOR(S) : Yasuyuki NAKAMURA, et al.

It is certified that error appears in the above-indentified patent and that said Letters Patent is hereby corrected as shown below:

On the title page, Item [54] and Column 1, Line 2, the title should read as follows:

--CURRENT CELL MATRIX D/A CONVERTER--

Signed and Sealed this

Twentieth Day of September, 1994

*Attest:*

*Attesting Officer*

BRUCE LEHMAN

*Commissioner of Patents and Trademarks*